(12) United States Patent
Kim et al.

(10) Patent No.: US 9,401,474 B2
(45) Date of Patent: Jul. 26, 2016

(54) METHODS OF FORMING STRUCTURES

(71) Applicant: Micron Technology, Inc., Boise, ID (US)

(72) Inventors: Hyun Sik Kim, Boise, ID (US); Irina V. Vasilyeva, Boise, ID (US); Kyle B. Campbell, Meridian, ID (US); Kyuchul Chong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 14/321,419

(22) Filed: Jul. 1, 2014

(65) Prior Publication Data
US 2016/0005966 A1    Jan. 7, 2016

(51) Int. Cl.
| H01L 45/00 | (2006.01) |
| H01L 27/24 | (2006.01) |
| H01L 21/56 | (2006.01) |
| H01L 21/02 | (2006.01) |

(52) U.S. Cl.
CPC ............ *H01L 45/16* (2013.01); *H01L 21/0214* (2013.01); *H01L 21/0217* (2013.01); *H01L 21/02126* (2013.01); *H01L 21/02271* (2013.01); *H01L 21/02348* (2013.01); *H01L 21/56* (2013.01); *H01L 27/2427* (2013.01); *H01L 27/2463* (2013.01); *H01L 45/12* (2013.01); *H01L 45/128* (2013.01); *H01L 45/1233* (2013.01); *H01L 45/144* (2013.01)

(58) Field of Classification Search
CPC ............ H01L 27/115; H01L 21/02164; H01L 21/0217; H01L 21/02178; H01L 21/02345; H01L 21/02348; H01L 45/1233
See application file for complete search history.

(56) References Cited

U.S. PATENT DOCUMENTS

| 8,207,557 | B2* | 6/2012 | Sills ................... H01L 27/2463 257/211 |
| 8,274,081 | B2 | 9/2012 | Mikhalev et al. |
| 8,426,308 | B2* | 4/2013 | Han ................. H01L 21/76801 257/621 |
| 8,937,011 | B2* | 1/2015 | Iuchi ................ H01L 21/76837 257/E21.585 |
| 2002/0015851 | A1* | 2/2002 | Higuchi .............. C08K 5/3492 428/447 |
| 2002/0064937 | A1* | 5/2002 | Kim ................. H01L 21/31111 438/623 |
| 2004/0113137 | A1* | 6/2004 | Lowrey ............... H01L 27/2481 257/5 |

(Continued)

OTHER PUBLICATIONS

U.S. Appl. No. 14/189,265, filed Feb. 25, 2014 by Campbell et al.

(Continued)

*Primary Examiner* — Bac Au
(74) *Attorney, Agent, or Firm* — Wells St. John P.S.

(57) ABSTRACT

Some embodiments include methods of forming structures. Spaced-apart features are formed which contain temperature-sensitive material. Liners are formed along sidewalls of the features under conditions which do not expose the temperature-sensitive material to a temperature exceeding 300° C. The liners extend along the temperature-sensitive material and narrow gaps between the spaced-apart features. The narrowed gaps are filled with flowable material which is cured under conditions that do not expose the temperature-sensitive material to a temperature exceeding 300° C. In some embodiments, the features contain memory cell regions over select device regions. The memory cell regions include first chalcogenide and the select device regions include second chalcogenide. The liners extend along and directly against the first and second chalcogenides.

11 Claims, 7 Drawing Sheets

(56) References Cited

U.S. PATENT DOCUMENTS

| | | | | |
|---|---|---|---|---|
| 2004/0224537 A1* | 11/2004 | Lee | C09D 183/16 | 438/782 |
| 2007/0196672 A1* | 8/2007 | Brand | C09D 183/16 | 428/447 |
| 2009/0004839 A1* | 1/2009 | Eun | C23C 16/045 | 438/597 |
| 2009/0004849 A1* | 1/2009 | Eun | H01L 21/76837 | 438/654 |
| 2010/0038617 A1* | 2/2010 | Nakajima | H01L 27/24 | 257/2 |
| 2010/0243980 A1* | 9/2010 | Fukumizu | H01L 27/101 | 257/2 |
| 2011/0049465 A1* | 3/2011 | Nagashima | H01L 27/0207 | 257/5 |
| 2011/0147942 A1* | 6/2011 | Yahashi | H01L 27/0688 | 257/773 |
| 2011/0309430 A1* | 12/2011 | Purayath | H01L 21/28273 | 257/321 |
| 2012/0001145 A1* | 1/2012 | Magistretti | H01L 27/2445 | 257/4 |
| 2012/0211721 A1* | 8/2012 | Kawai | H01L 27/2409 | 257/4 |
| 2013/0277640 A1* | 10/2013 | Nishimura | H01L 27/2409 | 257/5 |

OTHER PUBLICATIONS

U.S. Appl. No. 14/189,323, filed Feb. 25, 2014 by Campbell et al.
U.S. Appl. No. 14/189,490, filed Feb. 25, 2014 by Campbell et al.
U.S. Appl. No. 14/244,486, filed Apr. 3, 2014 by Campbell et al.

* cited by examiner

METHODS OF FORMING STRUCTURES

TECHNICAL FIELD

Methods of forming structures, such as, for example, three-dimensional memory arrays.

BACKGROUND

Temperature-sensitive materials may be utilized in numerous integrated circuit architectures, including, for example, fuses, wiring, logic, memory, etc. For example, phase change memory (PCM) may utilize temperature-sensitive chalcogenides. The temperature-sensitive materials may be chemically and/or physically altered, and even rendered inoperable, if exposed to temperatures exceeding about 300° C.

Conventional semiconductor fabrication frequently utilizes thermal processing for various depositions, cures, etc.; and such thermal processing often exceeds 300° C.

Challenges are encountered in developing fabrication sequences suitable for producing desired architectures with temperature-sensitive materials under conditions which do not expose the temperature-sensitive materials to detrimental thermal conditions. It is desired to develop improved fabrication methodologies which address such challenges.

DETAILED DESCRIPTION OF THE ILLUSTRATED EMBODIMENTS

Some embodiments include methods of filling spaces (i.e., gaps) between spaced-apart features. Such methods may include forming liners at least partially along sidewalls of the features, and subsequent utilization of flowable material to fill regions between the lined features. The liners may, for example, protect materials of the features from chemically reacting with the flowable material and/or may enhance bonding of the flowable material to alleviate delamination which could otherwise occur in the absence of the liners. Some embodiments include methodology which enables the liners and flowable material to be utilized while not exposing temperature-sensitive materials of the features to temperatures in excess of 300° C. Example embodiments are described below with reference to FIGS. 1-13.

Figure 1:
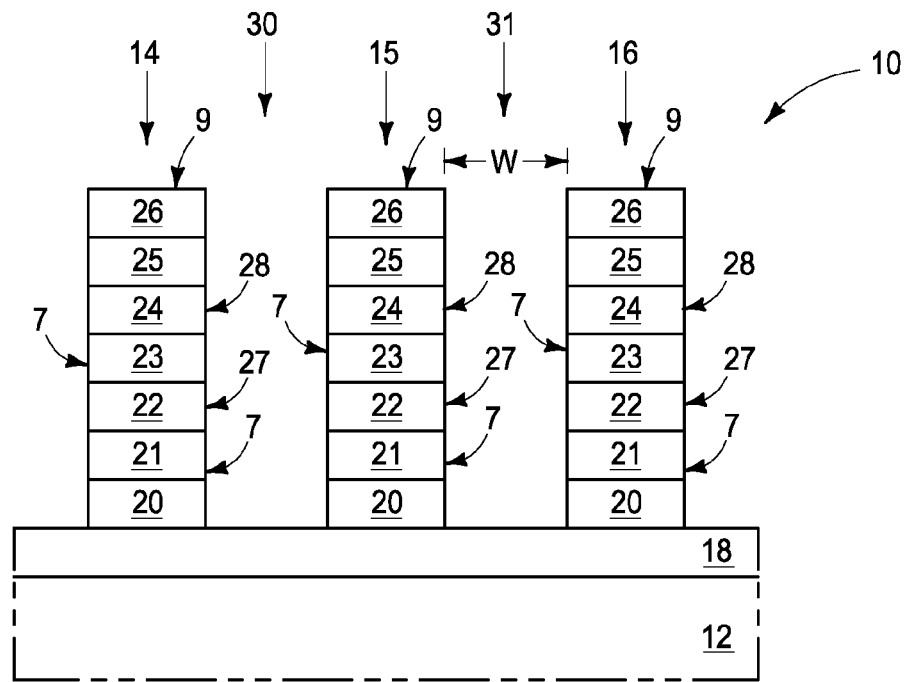
FIGS. 1-4 are diagrammatic cross-sectional views of a construction at process stages of an example embodiment method of forming example embodiment structures.

Referring to FIG. 1, a construction 10 comprises spaced-apart features 14-16. The features are over an insulative material 18, which is supported by a base 12. The features may, for example, correspond to pillars, correspond to lines extending in and out of the page relative to the view of FIG. 1, etc. In some embodiments, the features will ultimately be incorporated into a memory array. In such embodiments, two orthogonal crossing masks may be sequentially utilized to define pillars. The features of FIG. 1 may correspond to lines formed after the first of the crossing masks, or may correspond to pillars formed after the second of the crossing masks.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Some of the materials may be within the region of base 12 directly under the shown region of insulative material 18 and/or may be laterally adjacent the shown region of base 12; and may correspond to, for example, one or more of refractory metal materials, barrier materials, diffusion materials, insulator materials, etc.

The insulative material 18 may comprise any suitable composition or combination of compositions; and in some embodiments may comprise silicon nitride, silicon dioxide, borophosphosilicate glass, etc.

The illustrated features are utilized for fabrication of PCM array architecture, and comprise conductive material 20, first electrode material 21, select device material 22, second electrode material 23, phase change material 24, third electrode material 25, and electrically insulative capping material 26.

The conductive material 20 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). For instance, material 20 may comprise, consist essentially of, or consist of tungsten.

The electrode materials 21, 23 and 25 may comprise any suitable compositions or combinations of compositions. In some embodiments, two or more of the electrode materials may be the same composition as one another; and in other embodiments two or more of the electrode materials may be different compositions relative to one another. In some embodiments, the electrode materials may be formed from a conductive or semiconductor material, such as, for example, one or more of tungsten, platinum, palladium, tantalum, nickel, titanium nitride, tantalum nitride, tungsten nitride, polysilicon, metal silicide and carbon. In some embodiments, all of the electrode materials may comprise, consist essentially of, or consist of carbon.

The select device material 22 may comprise chalcogenide, and may be incorporated into an ovonic threshold switch (OTS). The chalcogenide may, for example, include one or more of sulfur, selenium, tellurium, germanium and antimony. The chalcogenide may be doped or undoped, and/or may have metal ions mixed therein. For instance, in some embodiments the chalcogenide may be an alloy including one or more of indium, selenium, tellurium, antimony, arsenic, bismuth, germanium, oxygen, tin, etc. An OTS is an example of one of many select devices which may be utilized. In other embodiments, other suitable select devices may include, for example, switches, field effect transistors, bipolar junction transistors, diodes, etc. In yet other embodiments, the select devices may be omitted.

The phase change material 24 may comprise any suitable material; and in some embodiments may comprise chalcogenide. The chalcogenide may include any of the materials described above with reference to chalcogenide suitable for utilization in the OTS; and in some embodiments may comprise germanium, antimony and tellurium (i.e., may comprise a material referred to as GST). The phase change material 24 and OTS material 22 may comprise a same chalcogenide composition as one another in some embodiments; and in other embodiments may comprise different chalcogenide compositions relative to one another. In some embodiments, the OTS material 22 and phase change material 24 may correspond to first and second chalcogenides, respectively; with such first and second chalcogenides being compositionally different from one another. In some embodiments, material 24 may be considered to be within memory cell regions and material 22 may be considered to be within select device regions.

The features may correspond to pillars, and the phase change material 24 may be within phase change memory cells in some embodiments. For instance, in some embodiments each feature may be considered to comprise a select device 27 comprising OTS material 22, and to comprise a memory cell 28 comprising phase change material 24. The memory cells may be incorporated into a memory array.

The capping material 26 may comprise any suitable composition or combination of compositions; and in some embodiments may be an insulative material. For instance, the capping material 26 may comprise, consist essentially of, or consist of silicon nitride.

The phase change material 24 and/or OTS material 22 may be a temperature-sensitive material; and specifically may comprise a material negatively impacted by exposure to a temperature in excess of 300° C. For instance, chalcogenide materials may be physically and/or chemically altered by exposure to temperatures in excess of 300° C., which may detrimentally affect performance of the chalcogenide materials, and which may even destroy operability of devices comprising the chalcogenide materials.

The materials 20-26 are example materials which may be utilized in features 14-16. In other embodiments, the features may have other configurations. For instance, in other embodiments the features may be configured for other applications besides fabrication of a PCM array. Regardless, the features 14-16 may comprise temperature-sensitive materials.

The features 14-16 may be formed with any suitable processing. For instance, in some embodiments a stack of materials 20-26 may be formed as an expanse across material 18, and subsequently such stack may be patterned utilizing an appropriate mask and one or more appropriate etches to form the features 14-16.

The features have upper surfaces 9 and sidewalls 7 extending from the upper surfaces to insulative material 18. The materials 20-26 have sidewall surfaces exposed along the sidewalls 7 in the shown embodiment.

The features 14-16 are spaced apart from one another by spaces (i.e., gaps) 30 and 31. Such spaces may have widths "W" of less than or equal to about 20 nm in some embodiments.

Figure 2:
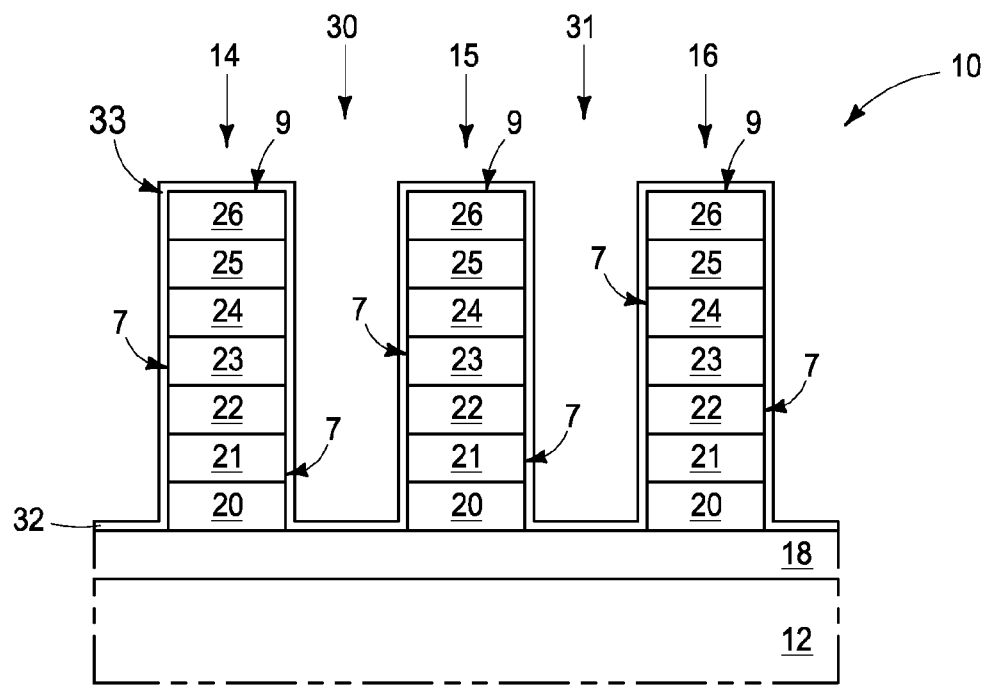

Referring to FIG. 2, liner material 32 is deposited over and between the features 14-16 to form a liner 33. The liner material extends along sidewalls 7 of the features 14-16, and is directly against sidewall surfaces of materials 20-26. The liner material 32 also extends across the upper surfaces 9 of the features 14-16.

The liner 33 may comprise any suitable composition or combination of compositions. For instance, in some embodiments the liner may comprise one or more of aluminum, nitrogen, oxygen, silicon and carbon.

The liner 33 may comprise a single homogeneous composition as shown, or may comprise a laminate of two or more different compositions (for instance, example laminates are described below with reference to FIGS. 10-13). In some embodiments, at least a portion of the liner 33 may comprise, consist essentially of, or consist of one or more of silicon nitride, silicon oxynitride and silicon carboxynitride. In some embodiments, at least a portion of the liner 33 may comprise, consist essentially of, or consist of aluminum in combination with one or more of silicon, carbon, nitrogen and oxygen (for instance, at least a portion of the liner may comprise, consist essentially of, or consist of one or more of AlO, AlSiN, AlSi(ON), AlSi(CN), etc.; where the chemical formulas indicate primary chemical constituents rather than any particular stoichiometry). In some embodiments, an entirety of the liner material 32 may comprise, consist essentially of, or consist of silicon nitride.

The liner 33 may be formed under conditions which do not expose temperature-sensitive materials 22 and 24 to temperatures exceeding 300° C. For instance, the liner may be formed utilizing atomic layer deposition, plasma enhanced chemical vapor deposition, chemical vapor deposition, etc. In embodiments in which liner material 32 comprises silicon nitride, such silicon nitride may be formed by, for example, plasma enhanced chemical vapor deposition (PECVD) utilizing silane and ammonia as precursors, and utilizing a temperature of less than or equal to about 250° C.

The liner 33 may be formed to any suitable thickness. In some embodiments, the liner may be formed to a thickness of from about 10 Å to at least about 100 Å; and in some embodiments may be formed to a thickness within a range of from about 20 Å to about 80 Å.

The liner 33 narrows the gaps 30 and 31 between the features.

Figure 3:
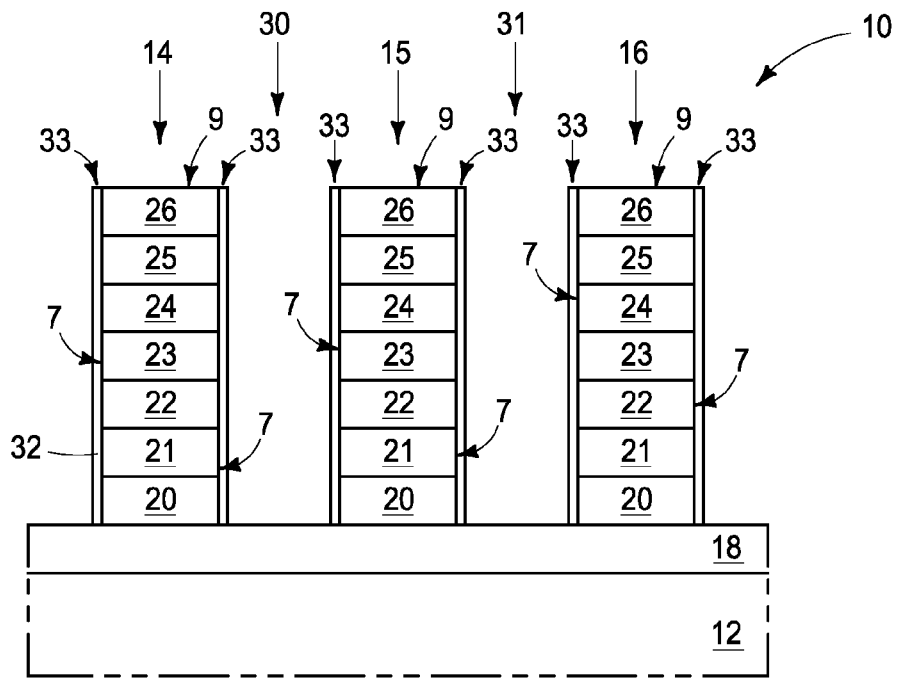

Referring to FIG. 3, liner material 32 is exposed to an anisotropic etch which removes the liner material from over horizontal surfaces, while leaving the liner material along vertical surfaces. Specifically, the liner material is removed from over upper surfaces 9 of features 14-16, and from over regions of material 18 between the features, while leaving the liner material along sidewalls 7 of the features. Accordingly, the anisotropic etching forms the liner material 32 into liners 33 which are only along the sidewalls 7 of features 14-16. In other embodiments, the liner material may be left in other configurations; and some examples of such other embodiments are described below with reference to FIGS. 5 and 6.

Figure 4:
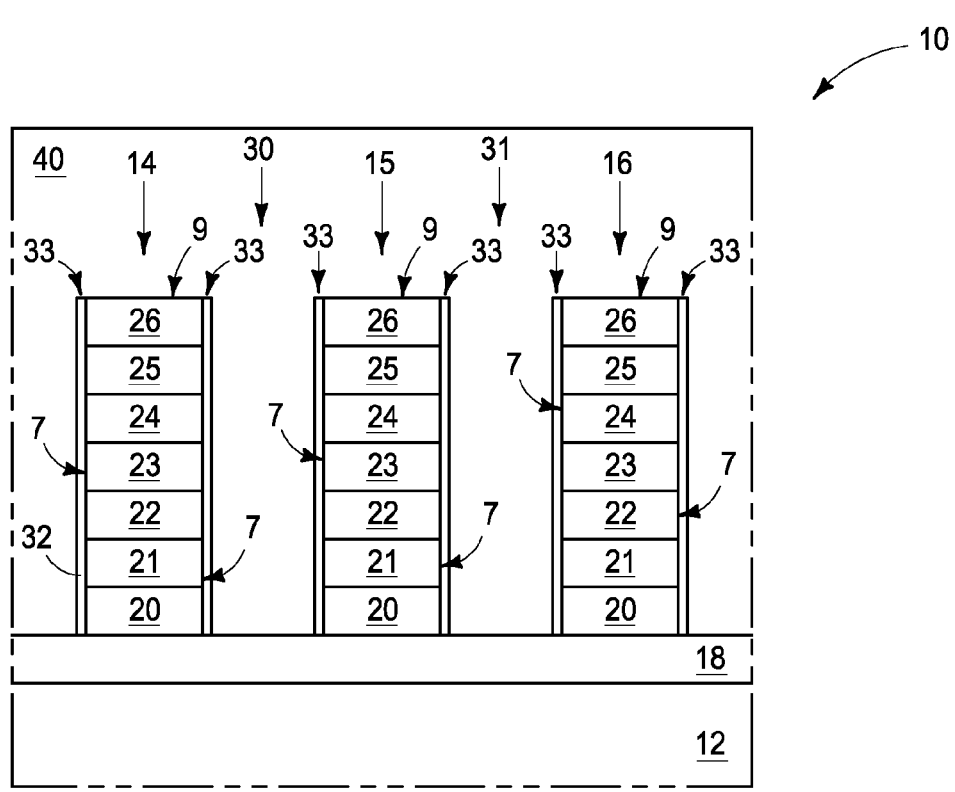

Referring to FIG. 4, material 40 is provided over and between features 14-16. The material 40 is a flowable material; such as, for example, spin-on dielectric (SOD), material formed with a flowable chemical vapor deposition (CVD), etc. The flowable material fills the gaps 30 and 31 which had been narrowed by liners 33. An advantage of flowable material is that such can fill very narrow gaps (such as, for example, gaps having widths of about 10 Å).

The flowable material may be subsequently cured utilizing a temperature which does not exceed 300° C. Accordingly, the temperature-sensitive materials 22 and 24 are not exposed to problematic high temperatures during the thermal cure of the flowable material.

In embodiments in which the flowable material comprises SOD, the SOD may be organic (for instance, may comprise one or more suitable siloxanes), or may be inorganic (for instance, may comprise one or more suitable silazanes). In some embodiments, the SOD comprises, consists essentially of, or consists of polysilazane, such as, for example, perhydropolysilazane. The perhydropolysilazane may be flowed across construction 10 while in a mixture with a solvent (for instance, dibutyl ether). After the mixture is flowed across construction 10, the mixture may be baked to substantially entirely remove the solvent. An example suitable bake may utilize a temperature of less than or equal to about 150° C. for a time within a range of from about one minute to about 10 minutes. After the solvent is removed, the perhydropolysilazane may be cured by, for example, exposing the perhydropolysilazane to an oxidative ambient and a temperature within a range of from about 80° C. to about 250° C. for a time of from about 30 minutes to about two hours. The oxidative ambient may comprise, for example, hydrogen peroxide ($H_2O_2$) or steam/$O_2$.

In some embodiments, the flowable material 40 is formed with a flowable CVD fill. The flowable CVD may comprise a deposit at a temperature at or below about room temperature (i.e., at or below about 25° C.). The material may comprise silicon, oxygen and carbon, and may be cured with a non-oxidizing ultraviolet cure at a temperature of less than or equal to about 250° C. to remove moisture and increase hardness. In some embodiments, the flowable CVD fill may comprise a bottom-up CVD process.

The utilization of liners 33 in combination with flowable material 40 may provide numerous advantages. Since the liner material 32 and flowable material 40 may be formed and cured utilizing temperatures of less than 300° C., insulative material may be formed between features 14-16 without exposing temperature-sensitive materials 22 and 24 to detrimental thermal conditions. Additionally, utilization of the liners 33 enables the flowable material 40 to be utilized without detrimental chemical interaction between the flowable material and the chalcogenide materials 22 and 24. For instance, if the flowable material 40 comprises oxygen, then oxidation may problematically occur if the material 40 directly contacts chalcogenide materials 22 and 24. However, liners 33 may function as barriers to eliminate direct contact between the chalcogenide materials and the oxygen-containing flowable material 40, and may thus prevent such problematic oxidation. Further, it is found that delamination may problematically occur if flowable material 40 directly contacts the carbon-containing electrode materials 21, 23 and 25. Accordingly, the liner material 32 may function to improve adhesion of the flowable material 40. Further, the flowable material 40 may provide advantages relative to other dielectric materials, in that it may be utilized to fill very small gaps, and accordingly may be utilized to uniformly and consistently fill gaps even as the gaps get smaller with increasing levels of integration.

An advantage of utilizing temperatures below 300° C., and in some embodiments no greater than 250° C., during the deposition of liner material 32 and cure of flowable material 40 may be to avoid damage to temperature-sensitive materials 22 and 24. Another advantage may be to avoid thermal migration of materials 22 and 24 across the intervening electrode material 23 which may otherwise lead to undesired detrimental intermixing of materials 22 and 24 in applications in which materials 22 and 24 are different compositions relative to one another.

The features 14-16 may be incorporated into a three-dimensional cross-point memory array comprising phase change memory cells. Such is an example architecture which may be formed utilizing the liners and flowable material to electrically isolate thermally-sensitive materials of semiconductor constructions. In other embodiments, the liners and flowable materials may be utilized to electrically isolate thermally-sensitive materials in other semiconductor constructions.

Figure 5:
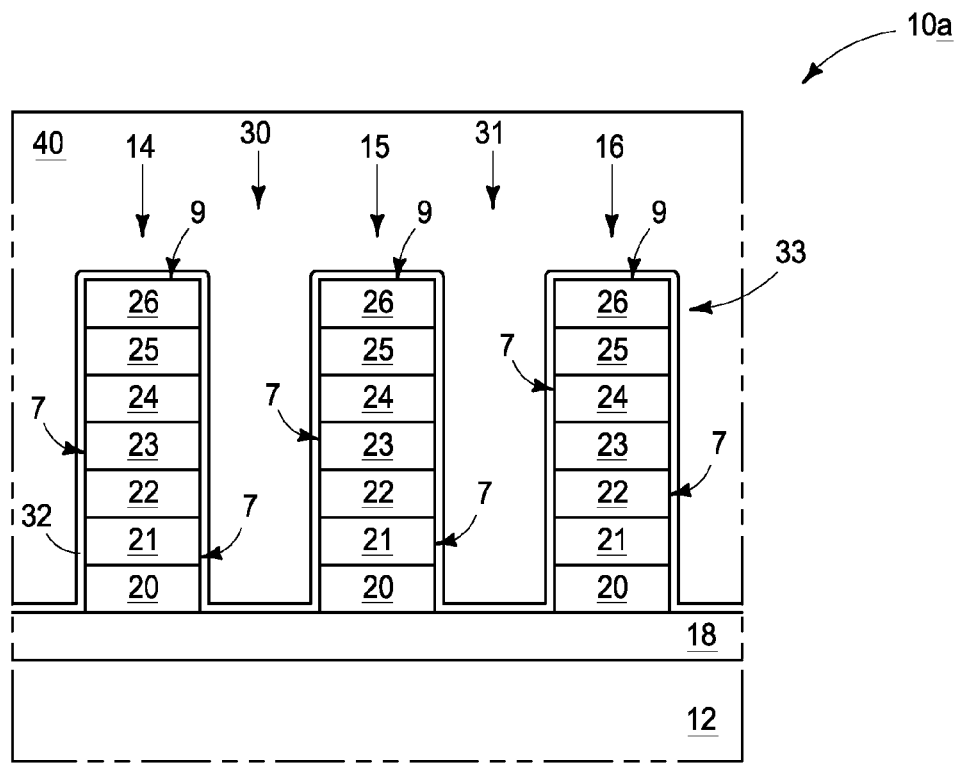
FIGS. 5 and 6 are diagrammatic cross-sectional views of constructions at process stages of other example embodiment methods of forming example embodiment structures. The process stages of FIGS. 5 and 6 may follow that of FIG. 2 in some embodiments.
Figure 6:
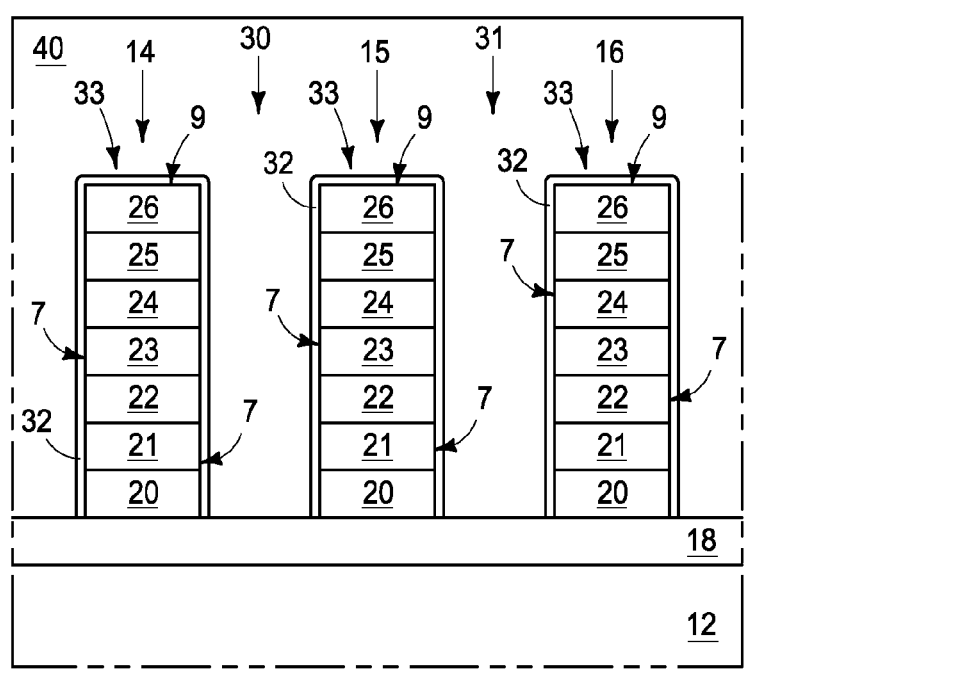

The embodiment of FIGS. 3 and 4 utilizes an anisotropic etch of liner material 32 to remove the material from over upper surfaces of features 14-16, and from regions between the features, prior to filling gaps 30 and 31 with flowable material 40. FIGS. 5 and 6 illustrate embodiments alternative to that of FIGS. 3 and 4.

FIG. 5 shows a construction 10a illustrating an embodiment in which liner material 32 is left in the configuration of FIG. 2 (i.e., is left to extend conformally along the top and sidewalls of features 14-16, and along regions of material 18 between the features) as material 40 is utilized to fill gaps 30 and 31. The embodiment of FIG. 4 may be considered to have physically separate liners along individual sidewalls of the features, whereas that of FIG. 5 may be considered to have liners comprised by a single expanse of liner material that extends along the individual sidewalls of the features, along bottoms of gaps between the features, and across tops of the features.

FIG. 6 shows a construction 10b in which liner material 32 only extends along the top and sidewalls of features 14-16 as the material 40 is utilized to fill gaps 30 and 31 between the features. The configuration of FIG. 6 may follow that of FIG. 2 in some embodiments, and the liners 33 of FIG. 6 may be formed utilizing an appropriate etch of the liner material 32 of FIG. 2. Alternatively, the embodiment of FIG. 6 may comprise selective deposition of liner material 32 along the tops and sidewalls of features 14-16 relative to the surface of material 18.

Figure 7:
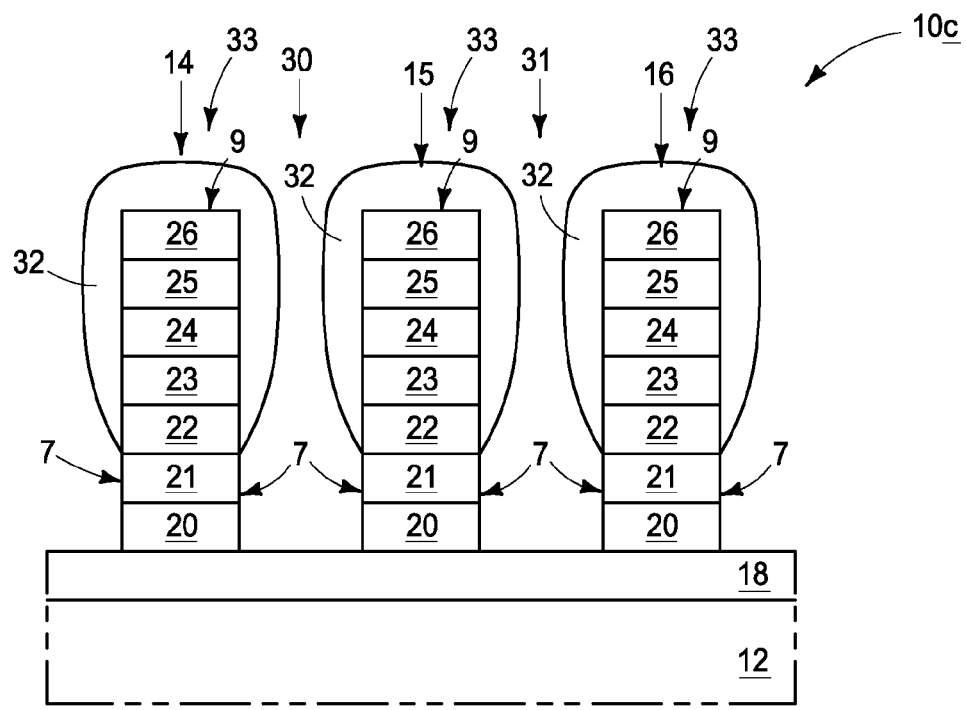
FIGS. 7 and 8 are diagrammatic cross-sectional views of a construction at process stages of another example embodiment method of forming example embodiment structures.
Figure 8:
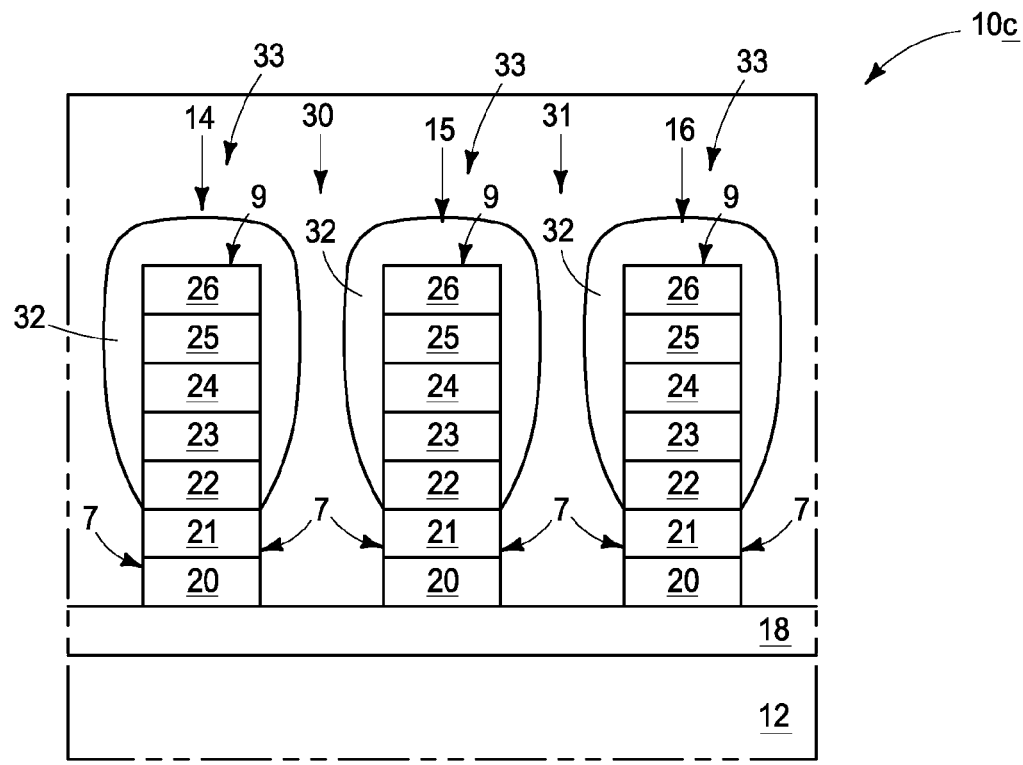

The embodiments of FIGS. 4-6 utilize liners 33 which are conformal along the sidewalls of features 14-16, and specifically which have a substantially uniform thickness along an entirety of the heights of individual sidewalls. The term "substantially uniform thickness" is utilized to indicate that the thickness is uniform to within reasonable tolerances of fabrication and measurement. FIGS. 7 and 8 illustrate an example embodiment in which liners are formed which do not have a substantially uniform thickness along the entirety of the heights of the sidewalls of the features.

Referring to FIG. 7, a construction 10c is shown at a processing stage subsequent to that of FIG. 1. Liner material 32 is formed non-conformally along features 14-16 to create liners 33. Specifically, the liner material is formed to be thicker at top regions of the features than at other regions beneath such top regions. In the shown embodiment, the liner material is thicker along sidewalls of phase change material 24 than along sidewalls of OTS material 22. For instance, the liner material may have a thickness of from about 10 Å to about 50 Å along OTS material 22, and may have a thickness within a range of from greater than about 50 Å to at least about 100 Å along phase change material 24.

Referring to FIG. 8, flowable material 40 is formed over and between features 14-16. The flowable material fills gaps 30 and 31 between the features, and uniformly fills regions under and between the non-conformal liners 33. The liner material 32 is provided to sufficient thickness to protect chalcogenide materials 22 and 24 from oxidation and/or other chemical reaction with the flowable material 40.

A problem which may occur in some applications is described with reference to a construction 10d of FIG. 9. The construction comprises a feature 14 and liners 33 along sidewalls of the feature. The liner material 32 of the liners is degraded during processing of flowable material 40. Specifically, the flowable material 40 may chemically react with the liner material 32 during the thermal cure and/or at other times. If the chemical reaction with liner material 32 entirely removes a section of the material to expose one or more of the materials 20-26, defects may occur. For instance, chemical reaction between material 40 and one or both of the chalcogenide materials 22 and 24 may occur; and/or material 40 may directly contact one or more of the electrodes 21, 23 and 25, and subsequently delaminate from such electrodes. The problems of FIG. 9 may occur in applications in which liner material 32 comprises silicon nitride and flowable material 40 comprises polysilane cured under oxidative conditions.

Figure 9:
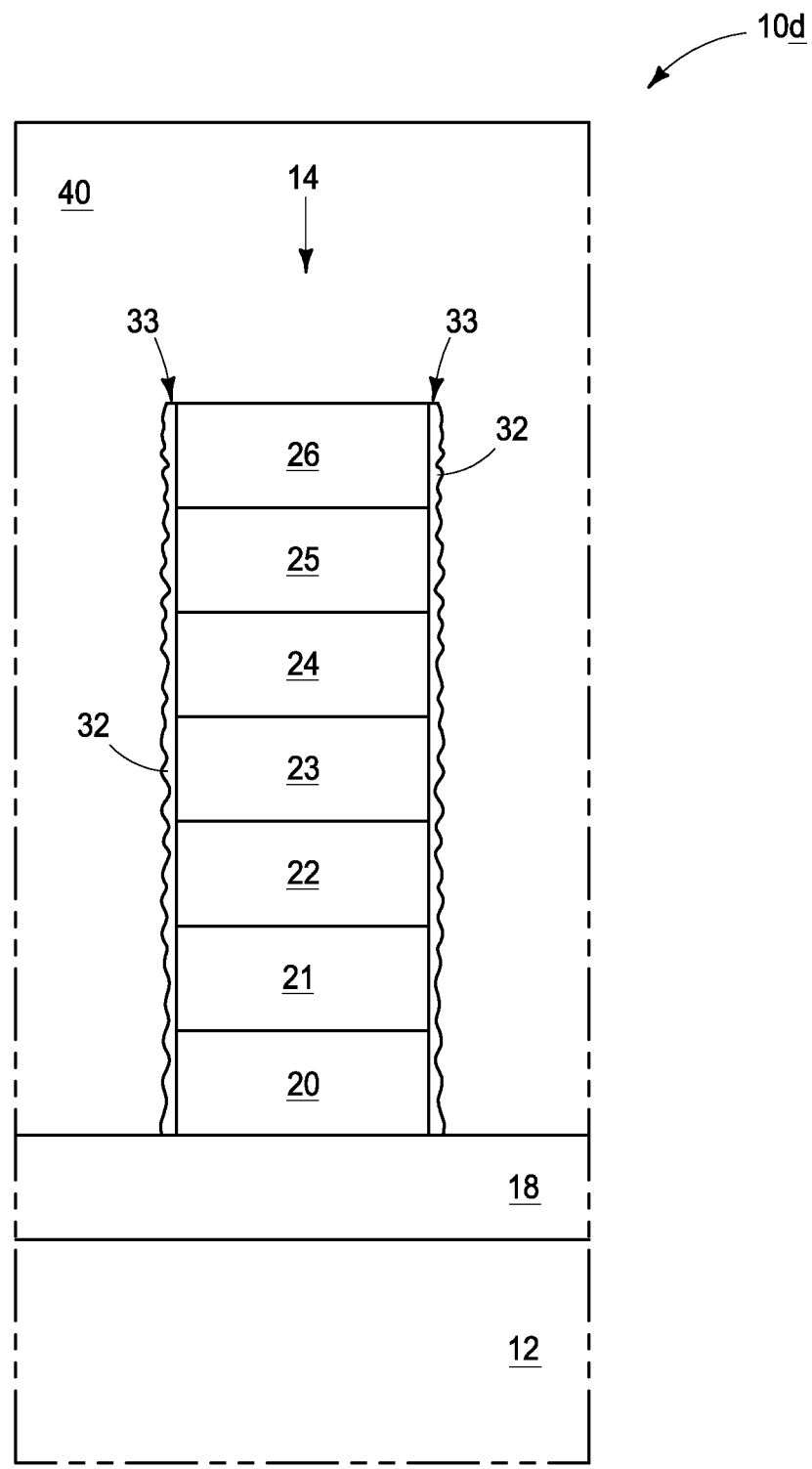
FIG. 9 is a diagrammatic cross-sectional view of a construction at a process stage of another example embodiment method of forming example embodiment structures.

One solution to the potential problems of FIG. 9 is to form the liner material 32 to be thick enough so that the degradation of the material 32 will not lead to exposure of any of the materials 20-26. Another solution to the potential problems of FIG. 9 is to utilize liner material which is resistant to chemical degradation by flowable material 40. However, it may be difficult to find a single material which has desired properties for adhering well to the materials 20-26 without chemically and/or physically degrading such materials, and which also is resistant to chemical degradation by flowable material 40. Accordingly, some embodiments utilize liners comprising laminates of two or more materials. Example embodiments utilizing laminate liners are described with reference to FIGS. 10-13.

Figure 10:
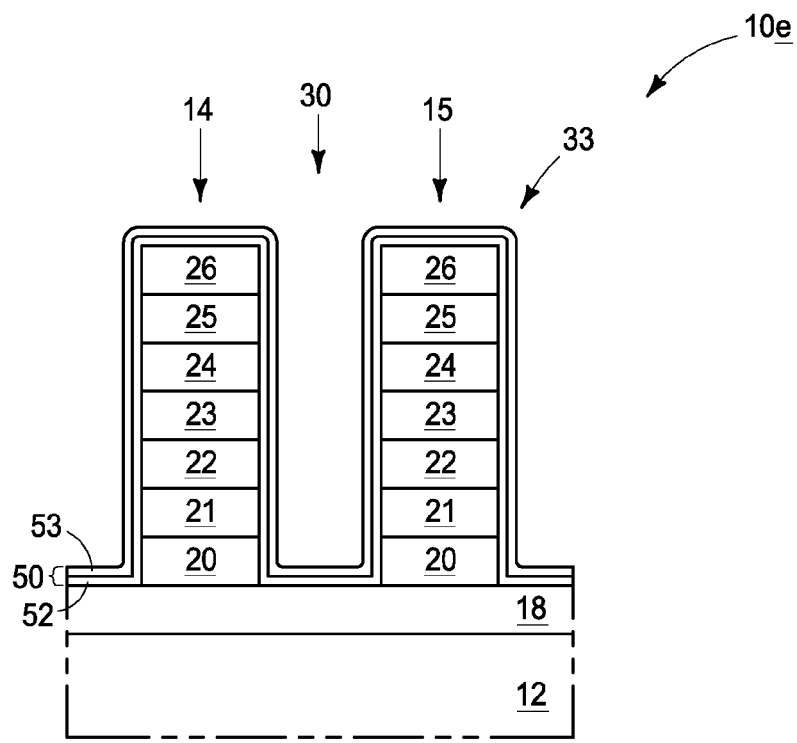
FIGS. 10-12 are diagrammatic cross-sectional views of a construction at process stages of another example embodiment method of forming example embodiment structures.

Referring to FIG. 10, a construction 10e is shown at a processing stage following that of FIG. 1. The construction includes a laminate 50 comprising liner materials 52 and 53. Such laminate extends over features 14 and 15, and within the gap 30 between such features. The laminate 50 forms a liner 33 over tops of the features and along sidewalls of the features.

The liner materials 52 and 53 may be configured so that material 52 is suitable for adhering to the materials 20-26 of the features, and so that material 53 is stable relative to chemical degradation by a flowable material subsequently provided between the features. In some embodiments, material 52 may comprise, consist essentially of, or consist of silicon nitride and/or silicon oxynitride; and material 53 may comprise, consist essentially of, or consist of aluminum in combination with one or more of oxygen, silicon, nitrogen and carbon (for instance, aluminum oxide, AlSiN, AlSi(ON), AlSi(CN), etc.; where the chemical formulas indicate primary chemical constituents rather than any particular stoichiometry).

Figure 11:
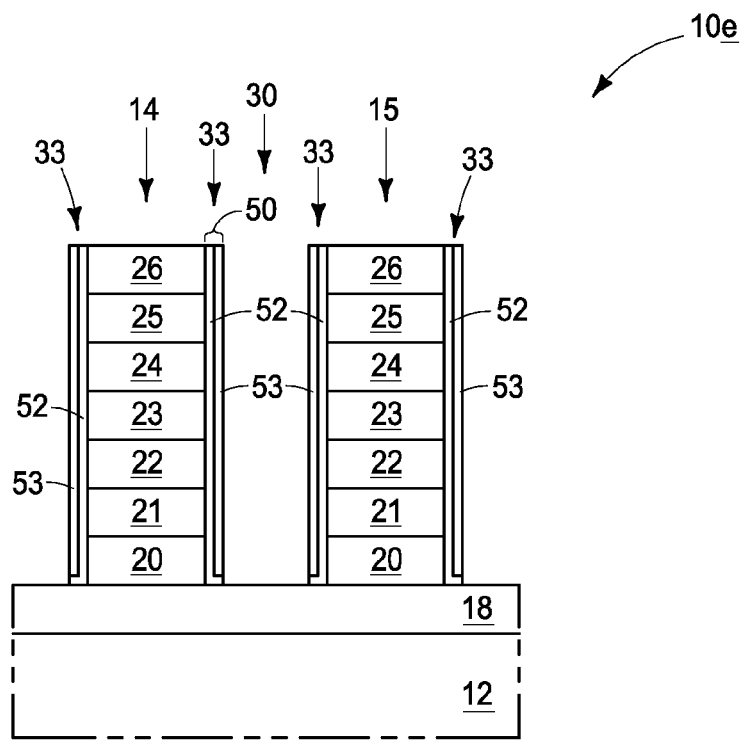

Referring to FIG. 11, laminate 50 is anisotropically etched to form liners 33 analogous to those described above with reference to FIG. 4.

Figure 12:
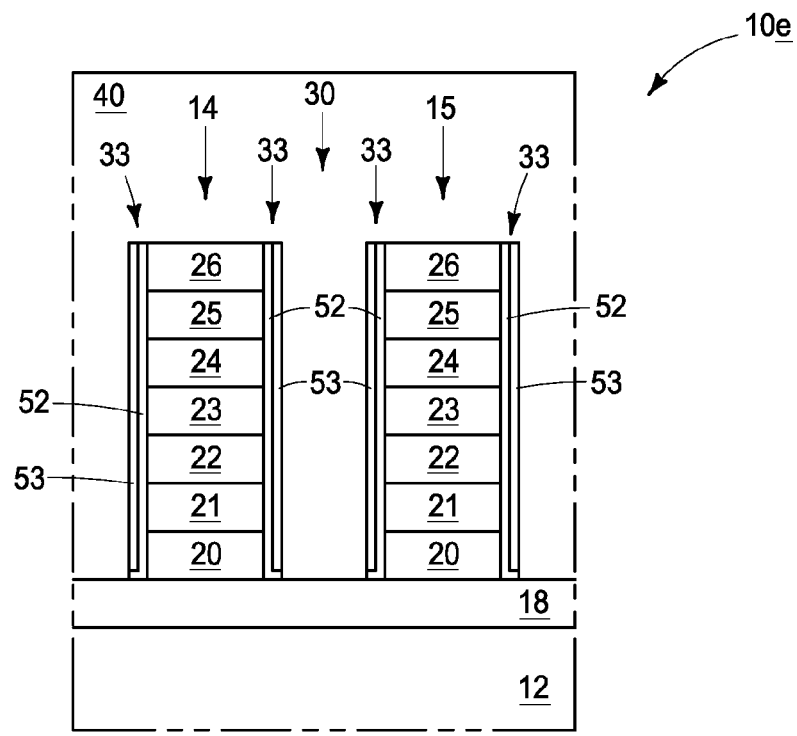

Referring to FIG. 12, flowable material 40 is formed over and between features 14 and 15 in a manner analogous to that described above with reference to FIG. 5. The liner material 53 may function as a barrier to protect liner material 52 from being degraded by the flowable material 40.

Figure 13:
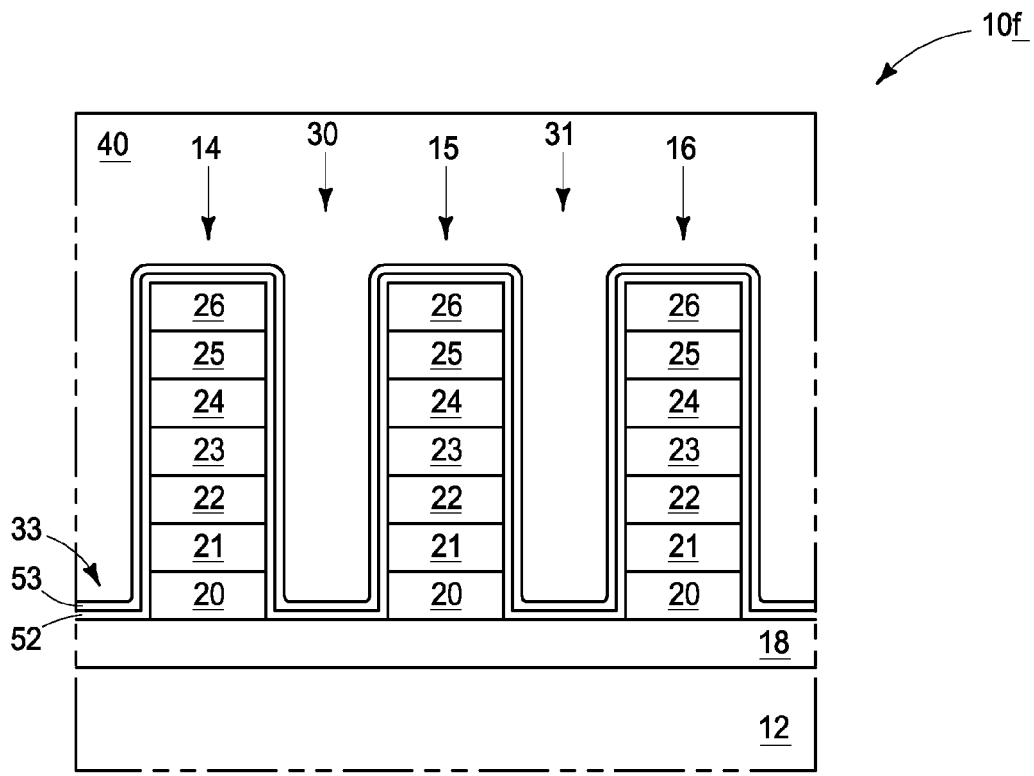
FIG. 13 is a diagrammatic cross-sectional view of a construction at a process stage of another example embodiment method of forming an example embodiment structure. The process stage of FIG. 13 may follow that of FIG. 10 in some embodiments.

Although the configuration of FIG. 12 shows the laminate liners 33 configured to be only along sidewalls of features 14 and 15, in other embodiments the laminate liners may have other configurations. For instance, the laminate liners may have configurations analogous to those described above with reference to the liners 33 of FIGS. 5-8. FIG. 13 shows an example embodiment construction 10f in which the laminate liners 33 have a configuration analogous to that described above with reference to the liner of FIG. 5, and specifically have a configuration in which the laminate liner remains over tops of the features and along regions of material 18 between the features as the flowable material 40 is formed over and between the features.

The features described above may, in some example embodiments, correspond to features utilized during fabrication of three-dimensional cross-point memory. In such embodiments, a first pattern may be formed along a first direction to define features corresponding to spaced-apart lines which extend along the first direction. One or more of the embodiments described in FIGS. 1-13 may be utilized to form liners along sidewalls of the lines, and to deposit and cure first flowable material between the lines. In subsequent processing, another pattern may be provided orthogonal to the first pattern to slice the lines into second features corresponding to pillars. One or more of the embodiments described in FIGS. 1-13 may be utilized to form liners along sidewalls of the pillars, and to deposit and cure second flowable material between the pillars. The first and second flowable materials may be the same as one another in some embodiments, and may be different from one another in other embodiments. In some embodiments, the liners formed along the first features (i.e., the lines) may be referred to as first liners, and the liners formed along the second features (i.e., the pillars) may be referred to as second liners. The first and second liners may be the same as one another in some embodiments, and may be different from one another in other embodiments.

The features discussed above may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" may both be utilized to describe materials having insulative electrical properties, and the terms are considered synonymous in this disclosure. The utilization of the term "dielectric" in some instances, and the term "electrically insulative" in other instances, may provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming structures. Spaced-apart features are formed which contain temperature-sensitive material. Liners are formed along sidewalls of the features under conditions which do not expose the temperature-sensitive material to a temperature exceeding 300° C. The liners extend along the temperature-sensitive material and narrow gaps between the spaced-apart features. The narrowed gaps are filled with flowable material which is cured under conditions that do not expose the temperature-sensitive material to a temperature exceeding 300° C.

Some embodiments include a method of forming structures in which spaced-apart features contain memory cell regions, with the memory cell regions comprising phase change material. Liners are formed along sidewalls of the features under conditions which do not expose the phase change material to a temperature exceeding 300° C. The liners extend along and directly against the phase change material. The liners narrow gaps between the spaced-apart features. The narrowed gaps are filled with flowable material which is cured under conditions that do not expose the phase change material to a temperature exceeding 300° C.

Some embodiments include a method of forming structures. Spaced-apart features are formed to contain memory cell regions over select device regions. The memory cell regions comprise first chalcogenide and the select device regions comprise second chalcogenide. Liners are formed along sidewalls of the features under conditions which do not expose the first and second chalcogenides to a temperature exceeding 300° C. The liners extend along and directly against the first and second chalcogenides. The liners narrow gaps between the spaced-apart features. The narrowed gaps are filled with flowable material which is cured under conditions that do not expose the first and second chalcogenides to a temperature exceeding 300° C.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming structures, comprising:
   forming spaced-apart features containing memory cell regions; the memory cell regions comprising phase change material;
   forming liners along sidewalls of the features under conditions which do not expose the phase change material to a temperature exceeding 300° C.; the liners extending along and directly against the phase change material; the liners narrowing gaps between the spaced-apart features;
   filling the narrowed gaps with flowable material and curing the flowable material under oxidative conditions which do not expose the phase change material to a temperature exceeding 300° C.; and
   wherein the liners comprise a laminate of an aluminum-containing material and silicon nitride, with the silicon nitride being directly against the sidewalls of the features.

2. The method of claim 1 wherein the aluminum-containing material is aluminum oxide.

3. The method of claim 1 wherein the liners have a substantially uniform thickness along an entirety of a height of individual sidewalls.

4. The method of claim 1 wherein the flowable material is spin-on dielectric.

5. The method of claim 1 wherein the flowable material comprises polysilazane.

6. The method of claim 1 wherein the flowable material comprises perhydropolysilazane, and further comprising curing the flowable material at a temperature within a range of from about 80° C. to about 250° C.

7. A method of forming structures, comprising:
   forming spaced-apart features containing memory cell regions over select device regions; the memory cell regions comprising first chalcogenide and the select device regions comprising second chalcogenide;
   forming liners along sidewalls of the features under conditions which do not expose the first and second chalcogenides to a temperature exceeding 300° C.; the liners extending along and directly against the first and second chalcogenides; the liners narrowing gaps between the spaced-apart features;
   filling the narrowed gaps with flowable material and curing the flowable material under oxidative conditions which do not expose the first and second chalcogenides to a temperature exceeding 300° C.; and
   wherein the liners comprise a laminate of aluminum oxide and silicon nitride, with the silicon nitride being directly against the sidewalls of the features.

8. The method of claim 7 wherein the liners have a substantially uniform thickness along an entirety of a height of individual sidewalls.

9. The method of claim 7 wherein the flowable material is spin-on dielectric.

10. The method of claim 7 wherein the flowable material comprises polysilazane.

11. The method of claim 7 wherein the flowable material comprises perhydropolysilazane, and further comprising curing the flowable material at a temperature within a range of from about 80° C. to about 250° C.

* * * * *